(12) United States Patent
Akaike et al.

(10) Patent No.: US 6,528,823 B2
(45) Date of Patent: Mar. 4, 2003

(54) SEMICONDUCTOR LIGHT-EMITTING ELEMENT AND METHOD OF MANUFACTURING THE SAME

(75) Inventors: Yasuhiko Akaike, Kawasaki (JP); Kazuyoshi Furukawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/961,177

(22) Filed: Sep. 24, 2001

(65) Prior Publication Data

US 2002/0036296 A1 Mar. 28, 2002

(30) Foreign Application Priority Data

Sep. 28, 2000 (JP) ......................... 2000-296823

(51) Int. Cl.[7] .................. H01L 29/06; H01L 33/00; H01L 33/072; H01L 31/109
(52) U.S. Cl. .................. 257/79; 257/94; 257/95; 257/96; 257/97; 257/12; 257/13; 257/103; 257/184; 257/201
(58) Field of Search .................. 257/94–97, 79, 257/12–13, 103, 184, 201

(56) References Cited

U.S. PATENT DOCUMENTS

| | | | | | |
|---|---|---|---|---|---|
| 4,731,789 A | * | 3/1988 | Thornton | ...... | 372/45 |
| 5,212,705 A | * | 5/1993 | Kahen et al. | ...... | 372/46 |
| 5,235,194 A | * | 8/1993 | Izumiya et al. | ...... | 257/13 |
| 5,319,657 A | * | 6/1994 | Otsuka et al. | ...... | 372/43 |
| 5,488,233 A | * | 1/1996 | Ishikawa et al. | ...... | 257/94 |
| 5,488,235 A | * | 1/1996 | Nozaki et al. | ...... | 257/94 |
| 5,506,423 A | * | 4/1996 | Saeki | ...... | 257/97 |
| 5,547,899 A | * | 8/1996 | Fujii et al. | ...... | 438/40 |
| 5,821,569 A | * | 10/1998 | Dutta | ...... | 257/96 |
| 5,854,090 A | * | 12/1998 | Iwai et al. | ...... | 438/47 |
| 6,121,635 A | * | 9/2000 | Watanabe et al. | ...... | 257/91 |
| 6,229,834 B1 | * | 5/2001 | Nisitani et al. | ...... | 372/45 |
| 6,265,732 B1 | * | 7/2001 | Nakatsu et al. | ...... | 257/86 |
| 2001/0020703 A1 | * | 9/2001 | Gardner et al. | ...... | 257/87 |
| 2001/0045564 A1 | * | 11/2001 | Koike et al. | ...... | 257/88 |

FOREIGN PATENT DOCUMENTS

JP    2000-101145    4/2000

OTHER PUBLICATIONS

J. F. Lin, et al., Solid–State Electronics, vol. 38, No. 2, pps. 305–308, "AlGaInP Orange Light–Emitting Diodes Grown on Misoriented p–GaAs Substrates," 1995.

J. F. Lin, et al., Jpn. J. Appl. Phys., vol. 33, Part 2, No. 6B, pps. L857–L859, "Effects of Substrate Misorientation and ZN Doping Characteristics on the Performance of AlGaInP Visible Light–Emitting Diodes," 1994.

* cited by examiner

*Primary Examiner*—Amir Zarabian
*Assistant Examiner*—Ida M. Soward
(74) *Attorney, Agent, or Firm*—Oblon, Spivak, McClelland, Maier & Neustadt, P.C.

(57) ABSTRACT

A semiconductor light-emitting element, including a double hetero structure formed of III–V group compound semiconductor layers including an active layer acting as a light emitting layer and an n-type cladding layer and a p-type cladding layer having the active layer sandwiched therebetween, a p-type layer laminated on the double hetero structure and containing a concentration of Zn as a dopant, and a Zn diffusion preventing layer interposed between the active layer of the double hetero structure and the p-type layer having a high Zn concentration.

11 Claims, 6 Drawing Sheets

SEMICONDUCTOR LIGHT-EMITTING ELEMENT AND METHOD OF MANUFACTURING THE SAME

CROSS-REFERENCE TO RELATED APPLICATIONS

This application is based upon and claims the benefit of priority from the prior Japanese Patent Application No. 2000-296823, filed Sep. 28, 2000, the entire contents of which are incorporated herein by reference.

BACKGROUND OF THE INVENTION

The present invention relates to a semiconductor light-emitting element and a method of manufacturing the same.

In recent years, proposed are various semiconductor light-emitting elements using an InGaAlP series material having light-emitting characteristics in the visible wavelength region. FIG. 7 is a cross sectional view showing as an example the construction of an LED (light emitting diode) using a conventional InGaAlP series material and producing a visible light output. As shown in the drawing, a double hetero structure including an active layer 53 and p-type and n-type cladding layers 54, 52 having the active layer 53 sandwiched therebetween is formed on an n-type GaAs substrate 50. Also, an electrode 57 is formed on the p-type cladding layer 54 and an electrode 58 is formed on the lower surface of the n-type GaAs substrate 50.

It is necessary to select most suitably the band gap of each of the layers 52 to 54 forming the double hetero structure in accordance with the design in order to obtain a desired wavelength of the emitted light and to confine carriers. Also, it is desirable for the lattice constant of each of the layers 52 to 54 to conform with the lattice constant of the substrate 50 in order to achieve a satisfactory epitaxial growth of the layers 52 to 54. It should be noted that InGaAlP, which is a III–V compound, contains III group elements of In, Ga and Al. Therefore, it is possible to design independently the band gap and the lattice constant of InGaAlP by suitably selecting the composition ratio of these III group elements of In, Ga and Al.

It is possible to select the wavelength of the emitted light within the visible light region when the InGaAlP series double hetero structure is formed by the layers 52 to 54. Also, it is possible to form the InGaAlP series double hetero structure by the epitaxial growth having a lattice alignment with the GaAs substrate that is the most general compound semiconductor substrate. It is possible to obtain easily the GaAs substrate 50, and the epitaxial growth layers 52 to 54 can also be formed relatively easily. However, the GaAs substrate 50 is defective in that the transmittance of the light of the visible region is low. As a result, the light emitted from the InGaAlP series double hetero structure 53 to 54 is partly absorbed by the GaAs substrate 50, with the result that it is unavoidable for the brightness of the LED to be lowered.

In order to avoid the decrease in the brightness, it is necessary to use a material transparent to the light of the visible region for forming the substrate. In general, GaP is known as a transparent material. However, a lattice alignment cannot be achieved between the GaP substrate and the InGaAlP series material, resulting in failure to achieve a satisfactory epitaxial growth.

In order to avoid the difficulty noted above, proposed is a wafer bonding method in which the InGaAlP epitaxial growth layer and the GaP substrate are subjected to the wafer bonding. In this method, an epitaxial layer is grown first on the GaAs substrate, followed by removing the GaAs substrate from the grown epitaxial layer and subsequently attaching a GaP substrate prepared in advance to the epitaxial growth layer. In this case, the resultant structure consisting of the epitaxial growth layer and the GaP substrate is subjected to a heat treatment while applying pressure to both the epitaxial growth layer and the GaP substrate so as to make the structure integral.

It is certainly possible for the wafer bonding method described above to improve the brightness of the LED. However, it is difficult to handle the epitaxial growth layer after removal of the GaAs substrate because the epitaxial layer is thin. Also, a special apparatus is required because a heat treatment is applied while applying pressure to the structure consisting of the GaP substrate and the epitaxial growth layer. Such being the situation, a problem remains unsolved in terms of the stability and the productivity of the wafer bonding process.

On the other hand, concerning the wafer bonding method, developed is a technology called a direction adhesion or a direct bonding in which wafers each having a clean surface are bonded to each other. For example, a direct bonding of silicon wafers is disclosed in Japanese Patent No. 1420109, filed in 1983. Also, a direct bonding of compound semiconductor wafers is disclosed in Japanese Patent No. 204637, filed in 1985.

The light emitting efficiency of the LED manufactured by applying the bonding technology noted above is about twice as high as that of the conventional LED that does not employ the bonding technology in the manufacturing process and, thus, the LED manufactured by applying the bonding technology is called a high brightness LED.

On the other hand, it has been clarified that the brightness of a high brightness LED is rendered markedly nonuniform depending on the product in the high brightness LED of the bonding type, compared with the conventional LED. The reason for this problem is as follows.

FIG. 8 is a cross sectional view showing the construction of an LED prepared by the direct bonding method described above. As shown in the figure, a so-called n-up structure consisting of a p-type cladding layer 54, an active layer 53, an n-type cladding layer 52 and an n-type current diffusion layer 51, which are laminated in the order mentioned as viewed from below in the drawing, is mounted to a p-type substrate 60 with adhesive layers 61 and 55 interposed therebetween. Where Zn is used as a p-type dopant, Zn is contained in each of all the layers ranging between the active layer 53 and the substrate 60. Particularly, in order to decrease the series resistance of the LED, it is necessary for a substrate having a high impurity concentration, e.g., an impurity concentration not lower than $1\times10^{18}$ cm$^{-3}$, to be used as the p-type GaP substrate 60. It should be noted that Zn contained in the p-type GaP substrate 60 and the InGaAlP epitaxial growth layers 54, 55, and 61 is diffused into the active layer 53 in the heat treating step after the direct bonding step. Zn diffused in the active layer 53 forms an impurity level in the active layer 53. Since the impurity level acts as a non-light-emitting center relative to the current injected carriers, the density of the non-light-emitting centers is increased with increase in the amount of Zn diffused into the active layer 53. It follows that the injected carriers are caused to disappear without passing through the route of light emission/recombination. As a result, the brightness of the LED chip is markedly lowered.

The situation pointed out above is described in detail in, for example, (Jpn. J. Appl. Phys Vol. 33 (1994) pp. L857 to L.859 "Effect of Substrate Micro-orientation and Zn Doping Characteristics on Performance of AlGaInP Visible Light Emitting Diode" and Solid State Electron Vol. 38, No. 2, PP. 305 to PP. 308, 1995 "AlGaInP ORANGE LIGHT EMITTING DIODES GROWN ON MISORIENTED p-GaAs SUBSTRATES").

The amount of Zn diffused into the active layer 53 is determined by the temperature and time of the heat treatment and by the amount of Zn held in the p-type layers acting as a diffusion source. Among these factors, it is possible to control the temperature and time of the heat treatment. The holding temperature of the actual heat treatment falls within a range of between 700° C. and 770° C., and the holding time is 1 hour.

It follows that, in order to control the amount of Zn diffused into the active layer 53, it is necessary to set constant the Zn concentration in each of the p-type GaP substrate 60, and the epitaxial layers 54, 55 and 61. Particularly, the GaP substrate 60 is thick and has a high carrier concentration, compared with the p-type epitaxial layers such as the cladding layer 54 and the adhesive layer 55. It follows that, in order to suppress the decrease and fluctuation in the brightness of the LED chip by suppressing Zn diffused into the active layer 53, it is considered highly effective to decrease the carrier concentration and to increase the stability of the Zn concentration in the GaP substrate 60. However, the use of a p-type GaP substrate of low and stable in impurity concentration leads to an increase in the series resistance of the LED chip. In addition, the cost of such a substrate of particular specification is high.

As described above, it is possible to increase the brightness of the conventional LED by directly bonding a GaP substrate to the InGaAlP series double hetero structure. In this structure, however, Zn used as a p-type dopant of the GaP substrate is diffused into the active layer so as to form a non-light-emitting center, with the result that the brightness of the LED is lowered.

The problem described above is inherent in not only the LED but also in a semiconductor laser constructed as shown in FIG. 9. In the semiconductor laser shown in FIG. 9, an n-type cladding layer 71, an active layer 72 and a p-type cladding layer 73 are formed in the order mentioned on a GaAs substrate 70. Further, an upper p-type cladding layer 75, a current facilitating layer 77 and a p-type GaAs layer 78 are laminated in the order mentioned on the p-type cladding layer 73 with an etching stopper layer 74 interposed between the p-type cladding layer 73 and the p-type cladding layer 75. Further, an n-type GaAs layer 76 is formed to surround the upper p-type cladding layer 75 and the current facilitating layer 77.

In the semiconductor laser of the described construction, the p-type GaAs layer 78 is formed by an epitaxial growth in direct contact with the n-type GaAs layer 76. In order to decrease the series resistance of the semiconductor laser, the p-type GaAs layer 78 is doped with Zn in a carrier concentration of about $2 \times 10^{18}$ cm$^{-3}$. However, the carrier concentration is actually fluctuated such that the carrier concentration is rendered higher or lower. Where the carrier concentration is fluctuated so as to be increased to exceed $2 \times 10^{18}$ cm$^{-3}$, the problem has been clarified that a large amount of Zn diffused from the p-type GaAs layer 78 into the active layer 72 through the current facilitating layer 77 during the power supply to the chip forms a non-light-emitting center so as to increase the value of the threshold current of the laser oscillation. Presently, the sole measure against the Zn diffusion is to control precisely the doping, with the result that it is unavoidable to manufacture an epitaxial wafer by a process of a very small margin. It follows that it is difficult to manufacture a semiconductor laser satisfactory in the light emitting efficiency with a high yield.

BRIEF SUMMARY OF THE INVENTION

According to an aspect of the present invention, there is provided a semiconductor light-emitting element, comprising a double hetero structure formed of III–V group compound semiconductor layers including an active layer acting as a light emitting layer and an n-type cladding layer and a p-type cladding layer having the active layer sandwiched therebetween; a p-type layer laminated on the double hetero structure and containing Zn as a dopant; and a Zn diffusion preventing layer interposed between the active layer of the double hetero structure and the p-type layer.

According to another aspect of the present invention, there is provided a method of manufacturing a semiconductor light emitting element by applying a wafer direct bonding technology, comprising forming a double hetero structure formed of III–V group semiconductor materials and including an n-type cladding layer, an active layer acting as a light emitting layer and a p-type cladding layer, which are laminated in the order mentioned, on a first substrate; forming a Zn diffusion preventing layer on the p-type cladding layer included in the double hetero structure; directly bonding a second substrate transparent to a light emitted from the active layer to the Zn diffusion preventing layer; and removing the first substrate.

DETAILED DESCRIPTION OF THE INVENTION

Some embodiments of the present invention will now be described with reference to the accompanying drawings.

The present invention includes the embodiments exemplified below:

(1) The double hetero structure is formed of an InGaAlP series materials, and the substrate is formed of p-type GaP.

(2) A p-type dopant of Zn and an n-type dopant of Si are doped in the Zn diffusion preventing layer, and the conditions of Na>Nd and Nd>$2\times10^{17} cm^{-3}$, where Na represents the impurity concentration of Zn and Nd represents the impurity concentration of Si, are satisfied.

(3) The Zn diffusion preventing layer has a composition of $In_{0.5}(Ga_{1-x}Al_x)_{0.5}P$ where $0<x<1$.

Where the double hetero structure is formed of an InGaAlP material in the case where the technical idea of the present invention is applied to a bonding type LED, it is desirable to use GaAs capable of the lattice alignment with the InGaAlP series material for forming the first substrate and to use a p-type GaP for forming the second substrate.

In the conventional high brightness LED using a direct wafer bonding technology, the decrease in the light emitting efficiency caused by the Zn diffusion into the active layer is generated in the process of the heat treatment under high temperatures. The Zn diffusion source in the heat treatment is considered to be greatly affected by the Zn diffusion from the p-type cladding layer, adhesive layer and the GaP substrate, particularly from the GaP substrate having a high carrier concentration and a large thickness. Under the circumstances, the present inventors have solved the problem by arranging a Zn diffusion preventing layer between the cladding layer and the substrate. To be more specific, the Zn diffusion preventing layer is interposed between the cladding layer and the substrate in the light emitting element of the construction that a transparent substrate is bonded to the double hetero structure so as to prevent the Zn diffusion from the transparent substrate into the active layer. The particular construction makes it possible to prevent a non-light-emitting center caused by a diffused Zn from being formed in the active layer. Further, since it is possible to prevent the Zn diffusion into the active layer, it is possible to set the Zn concentration at a sufficiently high level in the transparent substrate so as to lower the series resistance of the chip. It follows that it is possible to further improve the brightness and the stability.

Figure 1A:
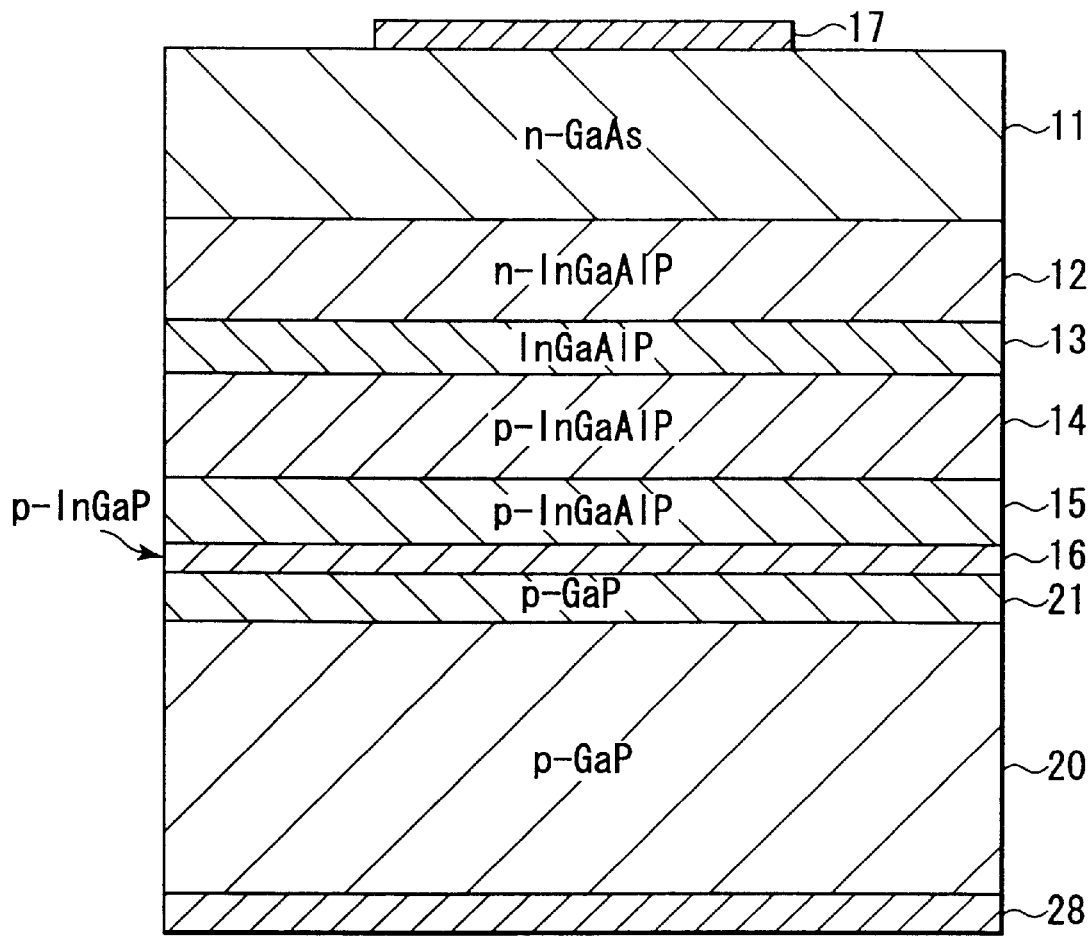
FIG. 1A is a cross sectional view showing the construction of an LED element according to a first embodiment of the present invention.

FIG. 1A is a cross sectional view showing the construction of a bonding type LED element according to a first embodiment of the present invention. As shown in FIG. 1A, a p-type GaP buffer layer 21 having a high impurity concentration is formed on a p-type GaP substrate 20. Further, a laminate structure consisting of a p-type InGaP adhesive layer 16, a Zn diffusion preventing layer 15 formed of a p-type InGaAlP material, a p-type InGaAlP cladding layer 14, an InGaAlP active layer 13, an n-type InGaAlP cladding layer 12, and an n-type GaAs current diffusion layer 11 is formed on the p-type GaP buffer layer 21. Further, an electrode 28 is formed on the lower surface (in the p-side) of the GaP substrate 20, and an electrode 17 is formed on the upper surface (in the n-side) of the current diffusion layer 11.

It should be noted that the layers 12, 13 and 14 shown in FIG. 1A collectively form a double hetero structure. The carriers are recombined so as to emit light in the active layer 13 included in the double hetero structure. The cladding layers 12 and 14 formed, respectively, on the upper surface and the lower surface of the active layer 13 serve to confine the carriers so as to improve the light emitting efficiency and, thus, have a band gap broader than that of the active layer 13. It should also be noted that it is necessary to select appropriately the band gaps of the layers 12, 13 and 14 included in the double hetero structure in accordance with the design in order to adjust the wavelength of the emitted light and to confine the carriers.

Figure 2A:
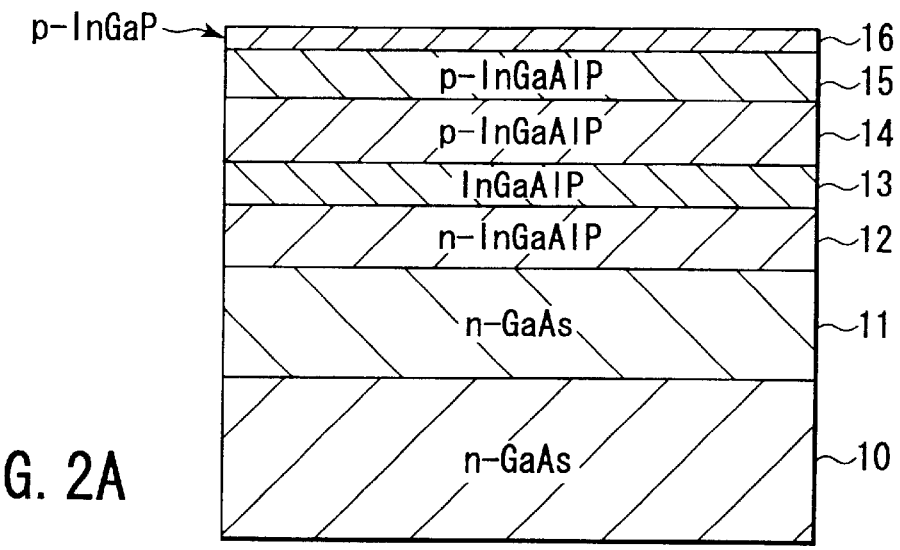
FIGS. 2A to 2C are cross sectional views collectively showing the manufacturing process of the LED element according to the first embodiment of the present invention.
Figure 2B:
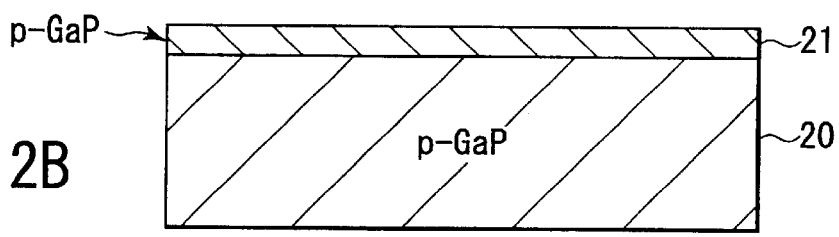
Figure 2C:
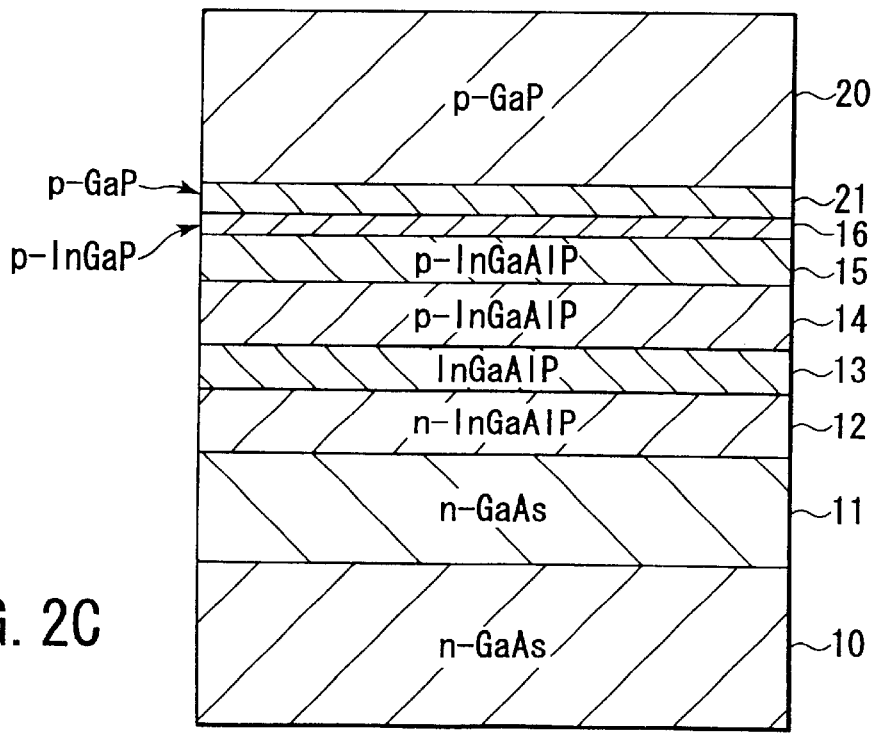

FIGS. 2A to 2C collectively show a method of manufacturing the bonding type LED of the construction described above. In the first step, the n-type GaAs current diffusion layer 11 is formed by an epitaxial growth on the n-type GaAs substrate (first substrate) 10, as shown in FIG. 2A. Then, the n-type InGaAlP cladding layer 12, the InGaAlP active layer 13, and the p-type InGaAlP cladding layer 14 are successively formed by the epitaxial growth on the n-type GaAs current diffusion layer 11 so as to form the double hetero structure. Further, the p-type Zn diffusion preventing layer 15 and the adhesive layer 16 are formed successively by the epitaxial growth on the p-type cladding layer 14.

In order to achieve a satisfactory epitaxial growth, it is desirable for the lattice constant of each of the layers 12, 13, 14 forming the double hetero structure to conform with the lattice constant of the GaAs substrate 10.

The InGaAlP layer, which is a III–V group compound layer, includes III group elements of In, Ga and Al, making it possible to design the band gap and the lattice constant independently by suitably selecting the ratio of these three elements of In, Ga and Al in the III–V group compound layer.

For example, suppose the epitaxially grown layer has a composition of: $In_x(Ga_{1-x}Al_y)_{1-y}P$. In this case, it is possible to allow the double hetero structure to have a lattice constant substantially equal to the lattice constant of the GaAs substrate 10 by setting the ratio x of In at 0.5. Also, it is possible to adjust the band gap by adjusting the component ratio y between Al and Ga while maintaining the ratio x of In at 0.5. To be more specific, it is possible to obtain an LED emitting a red light having a wavelength of 644 nm by setting the component ratios x and y of the active layer 13 at 0.5 and 0.43, respectively, and by setting the component ratios x and y of each of the cladding layers 12 and 14 at 0.5 and 0.7, respectively. On the other hand, it is possible to obtain an LED emitting a green light having a wavelength of 562 nm by setting the component ratios x and y of the active layer 13 at 0.5 and 0.454, respectively, and by setting the component ratios x and y of each of the cladding layers 12 and 14 at 0.5 and 1, respectively, i.e., each of these cladding layer is formed of InAlP.

On the other hand, prepared is a p-type GaP substrate (second substrate) 20 having a p-type GaP buffer layer 21, which has a high impurity concentration of about $1\times10^{18}$ $cm^{-3}$, grown on the surface as shown in FIG. 2B. Then, the multi-layer structure formed on the substrate 10 shown in FIG. 2A and the structure formed on the substrate 20 shown in FIG. 2B are directly bonded to each other to contact the adhesive layer 16 with the buffer layer 21, as shown in FIG. 2C. Namely, in the direct bonding step, the surface of the adhesive layer 16 and the surface of the GaP buffer layer 21 should be held clean. Then, a heat treatment is applied under a high temperature so as to increase the bonding strength of the layers 16 and 21.

It should be noted that, in the direct bonding technology of the wafers, the two substrates each having a mirror-like surface are allowed to be adhered to each other by their own force at room temperature under an atmosphere substantially free from a foreign matter, followed by applying a heat treatment to the bonded structure so as to bond and make the two substrates integral. In this technology, the entire surfaces of the two substrates are adhered to each other before the heat treatment so as to make it possible to bond the entire surfaces without leaving a non-bonded portion. The particular technology is also advantageous in that, since pressure need not be applied during the heat treatment, it is unnecessary to use a special apparatus or tool.

The mechanism of the direct bonding of the Si wafers, for example, is considered to be as follows. Specifically, OH groups are formed first on the surface of the wafer by the washing such as a water wash. Then, if the surfaces of the wafers are brought into mutual contact, the OH groups are attracted to each other by the hydrogen bond so as to achieve bonding of the wafers at room temperature. The bonding strength is so high that the ordinary warping of the wafer is corrected by the bonding strength so as to achieve the bonding on the entire surfaces of the Si wafers. Also, during the heat treatment, a dehydration condensation reaction takes place under temperatures exceeding 100° C. (Si—OH:HO—Si →Si—O—Si+$H_2O$) so as to cause the wafers to be bonded to each other with an oxygen atom interposed therebetween, thereby increasing the bonding strength. If the temperature is further elevated, the diffusion and rearrangement of atoms are brought about in the vicinity of the bonding interface, with the result that the wafers are made integral in terms of the mechanical strength and the electric characteristics. A similar bonding process is performed with respect to the III–V group compound semiconductor wafers.

In the next step, the GaAs substrate 10 is removed by the polishing or etching processes, followed by turning the resultant structure upside down. Under this condition, the electrode 17 formed in the n-side is mounted to the upper surface of the n-type current diffusion layer 11, and the electrode 28 in the p-side is mounted to the lower surface of the GaP substrate 20, thereby forming the InGaAlP series LED including the GaP substrate as shown in FIG. 1A.

Figure 8:
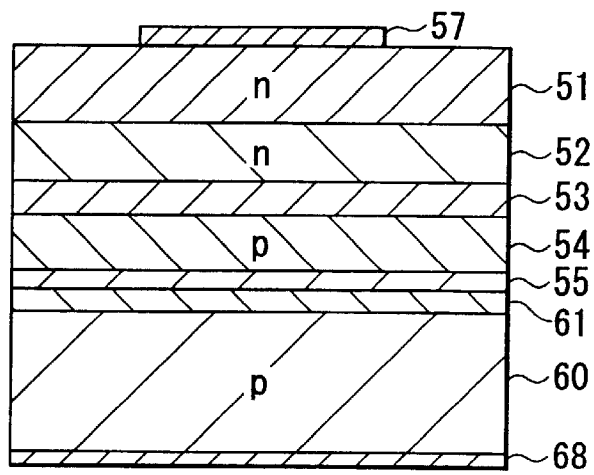
FIG. 8 is a cross sectional view showing a construction of a conventional bonding type LED element.
Figure 9:
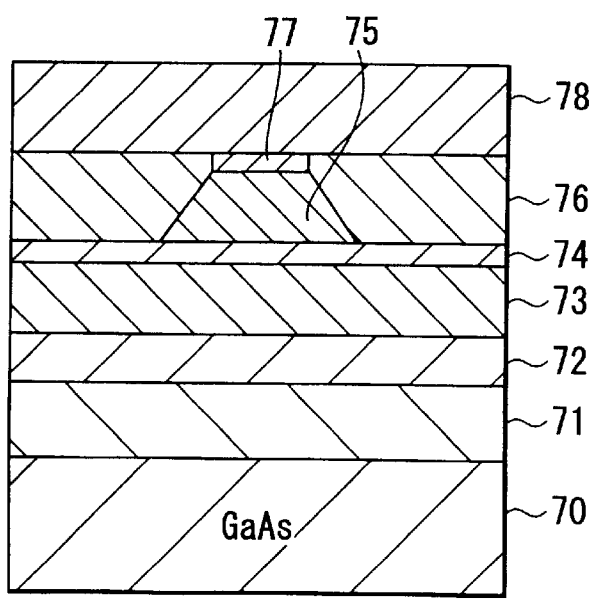
FIG. 9 is a cross sectional view exemplifying the construction of a conventional semiconductor laser element.

The construction according to the first embodiment of the present invention described above differs from the conventional construction shown in FIG. 8 in that the Zn diffusion preventing layer 15 is formed between the InGaP adhesive layer 16 and the p-type cladding layer 14 in the construction of the present embodiment.

The Zn diffusion preventing layer 15 according to the first embodiment of the present invention is doped with a p-type dopant of Zn and an n-type dopant of Si in a manner to satisfy the conditions in respect of the impurity concentration of Na>Nd and Nd>$2 \times 10^{17}$ cm$^{-3}$, where Na represents the impurity concentration of Zn and Nd represents that of Si.

In the process of developing the high brightness LED, the present inventors have looked into the problem in respect of the brightness reduction of the chip caused by the Zn diffusion into the active layer so as to find that Zn diffused from the p-type cladding layer into the active layer is not diffused into the n-type cladding layer but is accumulated in the interface between the n-type cladding layer and the active layer. In other words, it has been found that the Zn diffused within the InGaAlP layer is incapable of diffusion beyond the InGaAlP layer doped with Si. The reason for the particular phenomenon has not yet been clarified. However, it is considered reasonable to understand the situation as follows.

Specifically, since the amount of Zn diffused into the active layer well coincides with the carrier concentration measured by, for example, the CV measurement, it is considered reasonable to understand that the Zn atoms are migrated, i.e., diffused, while exchanging the position with the lattice point (vacancy) at which the III group atom is not present in the InGaAlP layer. However, if the vacancy is already occupied by an n-type dopant of Si, the vacancy that is to exchange the position is not present around the Zn atom and, thus, the Zn atom is incapable of exchanging the position. In other words, if Si is doped in a sufficiently large amount in the InGaAlP layer, the diffusion of Zn is prevented.

Figure 3:
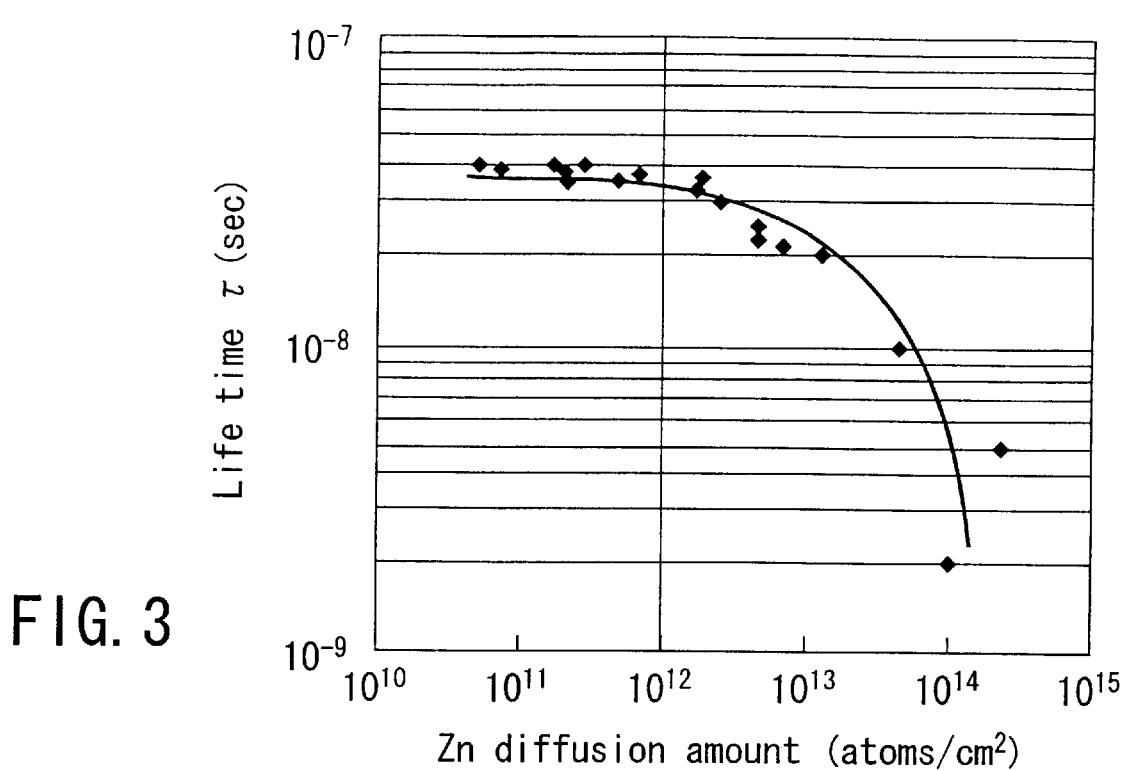
FIG. 3 is a graph showing the relationship between the Zn diffusion amount and the life time in the active layer.

Under the circumstances, the present inventors have conducted a research on the definition of the Si concentration required for preventing the Zn diffusion in the Zn diffusion preventing layer consisting of InGaAlP. First of all, the present inventors have found the relationship between the non-light-emission life time of carriers and the amount of the Zn diffusion as shown in FIG. 3. It should be noted that the non-light-emission life time is a good index denoting the crystallinity of the active layer. Specifically, the crystallinity of the active layer is improved with increase in the life time of the carriers. The relationship between the number of Zn atoms diffused into the active layer and the life time has been studies so as to find that the life time is shortened, i.e., the active layer is deteriorated, if Zn atoms are diffused into the active layer in an amount not smaller than $10^{12}$ atoms as shown in FIG. 3.

Figure 4:
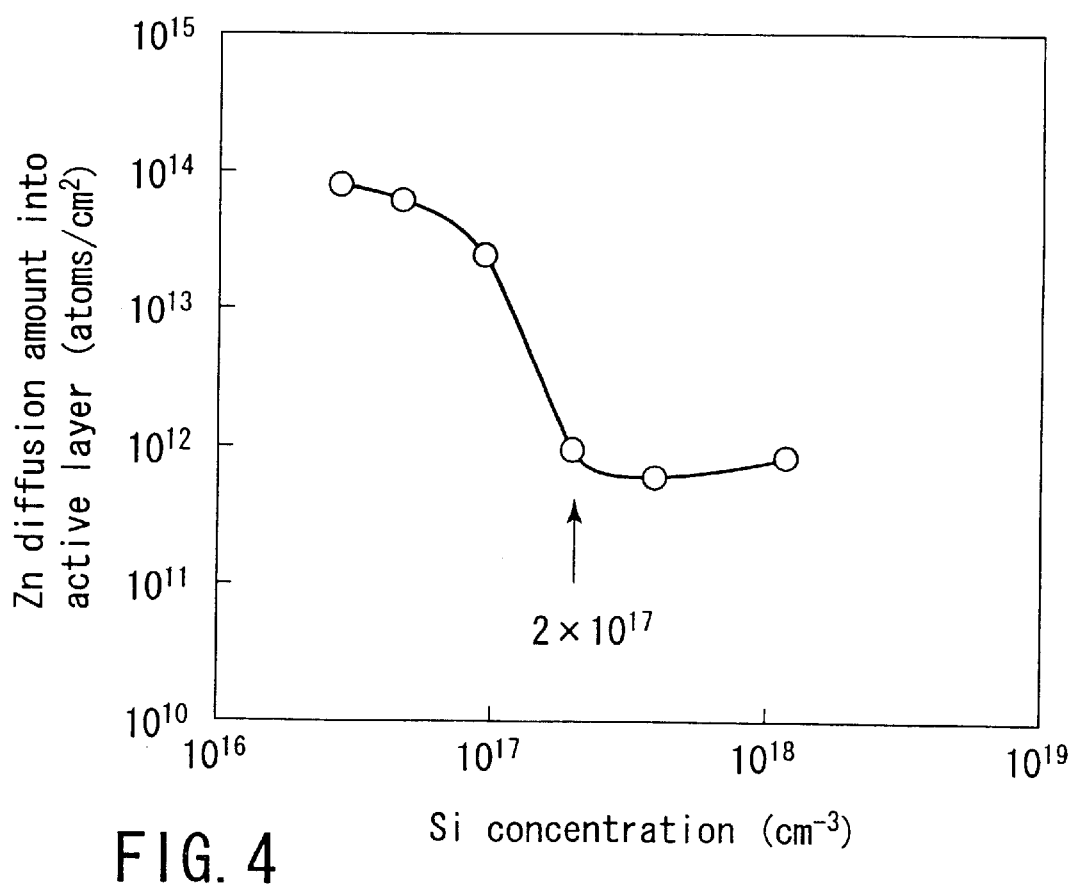
FIG. 4 is a graph showing the relationship between the Si concentration in the Zn diffusion preventing layer and the Zn diffusion amount into the active layer.

On the other hand, the relationship between the concentration of Si atoms doped in the Zn diffusion preventing layer and the number of the Zn atoms diffused into the active layer has been evaluated so as to obtain the result as shown in FIG. 4. The SIMS (Secondary Ion Mass Spectroscopy) method was employed for the quantitative analysis of the Si concentration and the Zn diffusion amount. The carrier concentration of the bonded GaP substrate 20 fell within a range of between $1 \times 10^{18}$ cm$^{-3}$ and $2 \times 10^{18}$ cm$^{-3}$. As a result, it has been found that it is possible to suppress the number of Zn atoms diffused into the active layer to $1 \times 10^{12}$ atoms when the Si concentration is not lower than $2 \times 10^{17}$ cm$^{-3}$, and that the number of Zn atoms diffused into the active layer is increased to $1 \times 10^{13}$ atoms as the Si concentration is not higher than $1 \times 10^{17}$ cm$^{-3}$ It follows that, in order to prevent the Zn diffusion into the active layer, it is necessary for the Si concentration in the Zn diffusion preventing layer to be more than $2 \times 10^{17}$ cm$^{-3}$.

The deterioration of the light emitting characteristics of the active layer after the heat treatment of the bonded wafer having the p-type GaP substrate bonded thereto is caused mainly by the presence of the non-light-emission center formed by the Zn atoms diffused from the GaP substrate. As apparent from the study described above, it is possible to prevent the Zn diffusion from the GaP substrate into the active layer by forming an InGaAlP layer containing Si in a concentration more than $2 \times 10^{17}$ cm$^{-3}$ between the GaP substrate and the active layer. It should be noted, however, that since Zn has a conductivity type of p-type, it is necessary for Zn to be doped in a concentration larger than the Si concentration.

Figure 1B:
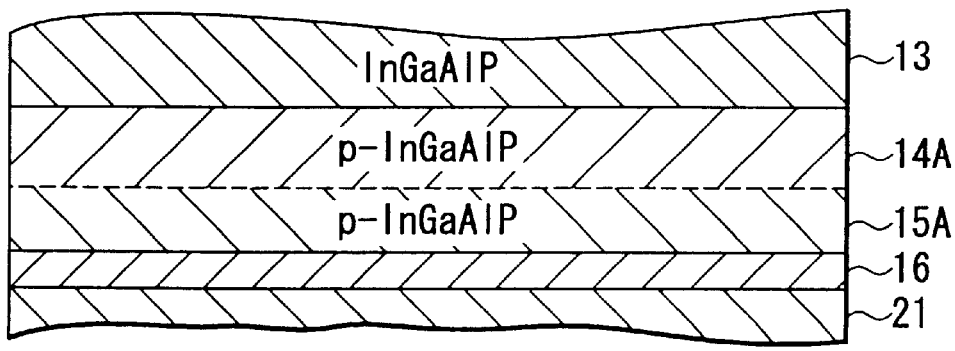
FIG. 1B is a cross sectional view showing the construction of a part of the LED element according to a modification of the first embodiment shown in FIG. 1A.

In the construction shown in FIG. 1A, it is conceivable to form the layer or a region containing at least $2 \times 10^{17}$ cm$^{-3}$ of Si in, for example, (1) the interface between the active layer 13 and the p-type cladding layer 14, (2) the interface between the p-type cladding layer 14 and the adhesive layer 16, and (3) the adhesive layer 16, i.e., the adhesive layer 16 is doped with Si. Since the interface (1) between the active layer 13 and the p-type cladding layer 14 is close to the active layer 13, it is possible for the doped silicon to form a non-light-emission center so as to deteriorate the crystallinity of the active layer 13. Also, in method (3) of doping the adhesive layer 16 with Si, the carrier concentration in the adhesive layer 16 is lowered so as to increase the resistance at the interface of the adhesive layer. Such being the situation, it is most desirable to form the layer doped with Si in the interface between the p-type cladding layer 14 and the adhesive layer 16. In this case, the characteristics of the chip are not adversely affected. It is apparent, however, that the object of preventing the Zn diffusion from the substrate 20 can be achieved by forming a Zn diffusion preventing layer 15A doped with Si in a part of the p-type cladding layer 14A as shown in FIG. 1B, not at the interface between the p-type cladding layer 14 and the adhesive layer 16 referred to above.

As described above, the Zn diffusion preventing layer 15 or 15A according to the first embodiment of the present invention is greatly featured in that the Zn diffusion preventing layer is doped with both Zn and Si. The composition of the Zn diffusion preventing layer 15 or 15A is not particularly limited as far as the Zn diffusion preventing layer is formed of an InGaAlP layer that does not absorb the PL light. However, it is desirable to use an InGaAlP layer having a small Al component ratio in view of the surface morphology and the resistivity of the layer. The thickness of the Zn diffusion preventing layer is not particularly limited either, as far as the object of preventing the Zn diffusion can be achieved. However, it is desirable for the Zn diffusion preventing layer to have a thickness not smaller than 0.1 $\mu$m in order to permit a uniform doping of Si.

Figure 5A:
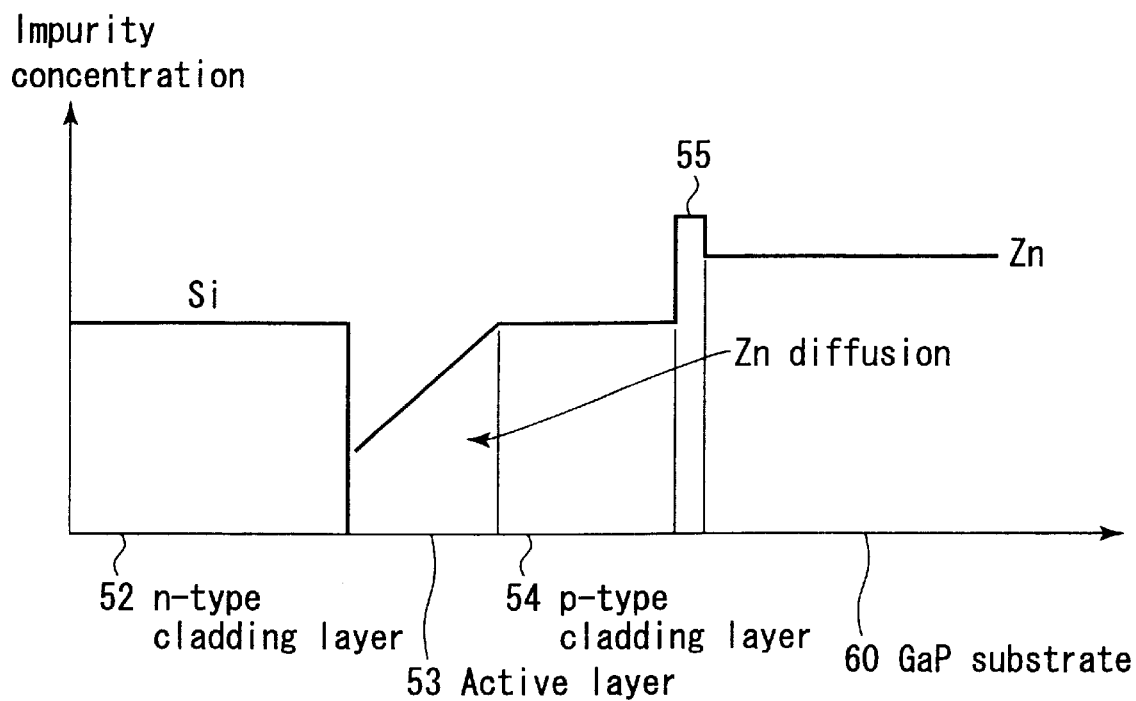
FIG. 5A is a graph schematically showing the impurity concentration profile in the conventional bonding type LED.
Figure 5B:
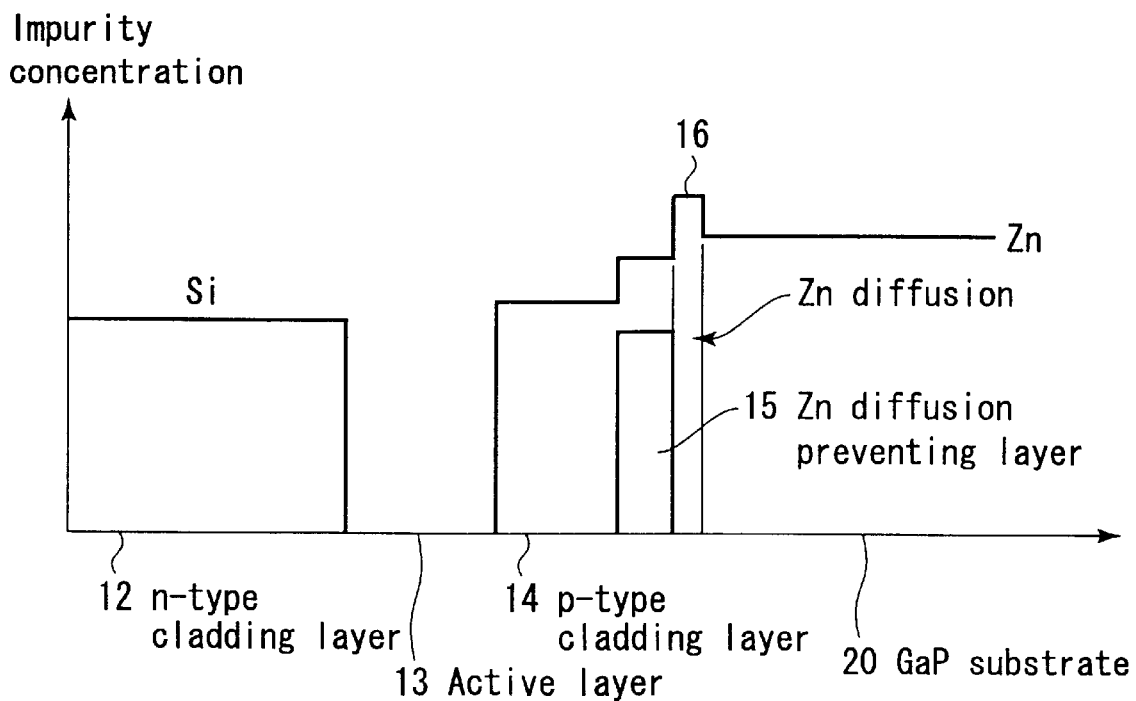
FIG. 5B is a graph schematically showing the impurity concentration profile in the bonding type LED according to the first embodiment of the present invention.

The first embodiment of the present invention shown in FIG. 1A will now be compared with a conventional example in respect of the dopant profile. Specifically, FIG. 5A schematically shows the dopant profile of the conventional LED using the bonding technology. On the other hand, FIG. 5B schematically shows the dopant profile of the LED according to the first embodiment of the present invention including the Zn diffusion preventing layer. In the conventional LED shown in FIG. 8, Zn atoms are diffused from the GaP substrate 60 having a high Zn concentration into the active layer 53 because of the presence of the Zn concentration gradient. On the other and, the LED according to the first embodiment of the present invention includes the Zn diffusion preventing layer 15 serving to prevent the Zn diffusion from the substrate 20. As a result, Zn atoms diffused from only the p-type cladding layer 14 into the active layer 13 are very small and can be ignored as shown in FIG. 5B. It follows that the Zn diffusion into the active layer 13 can be suppressed in the LED of the present invention, compared with the conventional LED, with the result that an LED of a high brightness can be obtained with a high stability in the present embodiment.

As described above, in the first embodiment of the present invention shown in FIG. 1A, the Zn diffusion preventing layer 15 of an InGaAlP layer is formed between the p-type cladding layer 14 included in the InGaAlP series double hetero structure and the p-type GaP substrate 20 directly bonded to the p-type cladding layer 14. It should also be noted that the Si impurity concentration Nd in the Zn diffusion preventing layer 15 is defined to be larger than $2 \times 10^{17}$ cm$^{-3}$, and that the Zn impurity concentration in the Zn diffusion preventing layer 15 is defined to be larger than the Si impurity concentration noted above in the embodiment of the present invention. The particular construction makes it possible for the Zn diffusion preventing layer 15 to inhibit without fail the Zn diffusion from the p-type GaP substrate 20. It follows that it is possible to prevent the Zn diffusion from the substrate 20 into the active layer 13. What should be noted is that it is possible in the embodiment of the present invention to suppress the formation of the non-light-emitting center in the active layer 13 so as to make it possible to further improve the brightness and the stability of the LED. This is also the case with the modified embodiment shown in FIG. 1B.

As described above in detail, the first embodiment of the present invention is directed to the construction of a light emitting element in which a transparent substrate is directly bonded to the double hetero structure, and a Zn diffusion preventing layer is formed between the double hetero structure and the substrate. The particular construction makes it possible to prevent the diffusion of the p-type dopant from the substrate into the active layer so as to suppress the formation of the non-light-emitting center. As a result, the brightness and the stability of the LED can be further improved. It follows that it is possible to manufacture the light emitting elements of a high brightness with a high stability.

The present invention is not limited to the embodiment described above. For example, the compound semiconductor forming the double hetero structure is not limited to the InGaAlP series semiconductor material. Alternatively, it is possible to use various other III–V group compound semiconductor materials. Also, the substrate bonded to the double hetero structure is not limited to a GaP substrate. Alternatively, it is also possible to use any material for forming the substrate as far as the material is transparent to the light emitted from the active layer and the resistivity of the substrate can be sufficiently lowered by the impurity doping. Further, the n-type dopant is not limited to Si. Alternatively, it is also possible to use Te or S as the n-type dopant.

Further, the first embodiment described above is directed to an LED (Light Emitting Diode). However, the technical idea of the present invention can also be applied to a semiconductor laser.

A second embodiment of the present invention, which is directed to a red semiconductor laser, will now be described with reference to FIGS. 6A to 6D. FIG. 6D is a cross sectional view showing the construction of the semiconductor laser according to the second embodiment of the present invention. As shown in FIG. 6D, an n-type cladding layer 31, an active layer 32 and a lower p-type cladding layer 33 are successively formed in the order mentioned by an MOCVD method on a GaAs substrate 30.

Further, a ridge-shaped upper cladding layer 36 is formed on the lower p-type cladding layer 33 with an etching stopper layer 34 interposed therebetween, and a current facilitating layer 37 is formed on the upper surface of the upper cladding layer 36.

Still further, an n-type GaAs layer 35 is formed in a manner to surround the ridge-shaped upper cladding layer 36 and the current facilitating layer 37. The upper surfaces of the current facilitating layer 37 and the n-type GaAs layer 35 are covered with a Zn diffusion preventing layer 38, and a p-type GaAs layer 39 is formed to cover the upper surface of the Zn diffusion preventing layer 38.

The GaAs substrate 30 is formed of a substrate doped with Si. The n-type cladding layer 31 is formed of an InGaAlP layer doped with Si. The active layer 32 is formed of an undoped InGaAlP layer. Each of the upper and lower p-type cladding layers 36 and 39 is formed of an InGaAlP layer doped with Zn. Further, each of the etching stopper layer 38 and the current facilitating layer 37 is formed of an InGaAlP layer doped with Zn.

In the second embodiment of the present invention, the Zn diffusion preventing layer 38 is interposed between the n-type GaAs layer 35 and the p-type GaAs layer 39 in order to suppress the Zn diffusion into the active layer 32. Since the Zn diffusion preventing layer 38 is formed of a GaAs compound semiconductor, the Zn diffusion preventing layer 38 can be formed by the process equal to the ordinary epitaxial growth process of the p-type GaAs.

The Zn diffusion preventing layer 38 is doped with two kinds of impurities, i.e., Zn and Si, and exhibits as a whole a p-type electrical conductivity. Therefore, it is necessary for the Zn concentration in the Zn diffusion preventing layer 38 to be higher than at least the Si concentration. In addition, it is necessary to provide a difference between the Zn concentration and the Si concentration in order to maintain the resistivity of the layer 38 at a low level.

For example, where Zn is doped in a concentration of $2 \times 10^{18}$ cm$^{-3}$, it is desirable for Si to be doped in a concentration not higher than $1 \times 10^{18}$ cm$^{-3}$. It should be noted, however, that, if the Si concentration is lower than $2 \times 10^{17}$ cm$^{-3}$, it is impossible to obtain the effect of sufficiently suppressing the Zn diffusion. It follows that the lower limit of the Si concentration is $2 \times 10^{17}$ cm$^{-3}$.

As described above, the Zn diffusion into the active layer 32 can be effectively suppressed by arranging the Zn diffusion preventing layer 38 between the p-type GaAs layer 39 having a high Zn concentration and the active layer 32. Even where Zn is doped in a concentration higher than the desired carrier concentration, it is possible to prevent an increase in the threshold value current and the deterioration in the reliability over a long time.

The manufacturing process of the semiconductor laser constructed as shown in FIG. 6D will now be described with reference to FIGS. 6A to 6C.

Figure 6A:
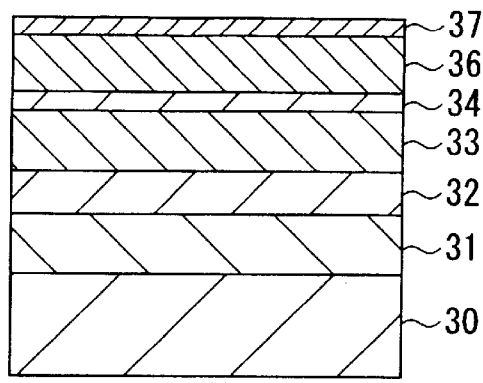
FIGS. 6A to 6D are cross sectional views collectively showing a method of manufacturing a semiconductor laser structure according to a second embodiment of the present invention.

In the first step, a GaAs substrate 30 doped with Si is prepared, followed by forming successively an n-type cladding layer 31, an active layer 32, and a p-type lower cladding layer 33 by an MOCVD method on the GaAs substrate 30, as shown in FIG. 6A.

Then, a p-type upper cladding layer 36 is formed above the p-type lower cladding layer 33 with an etching stopper layer 34 interposed therebetween, followed by further forming a current facilitating layer 37 on the p-type upper cladding layer 36.

Figure 6B:
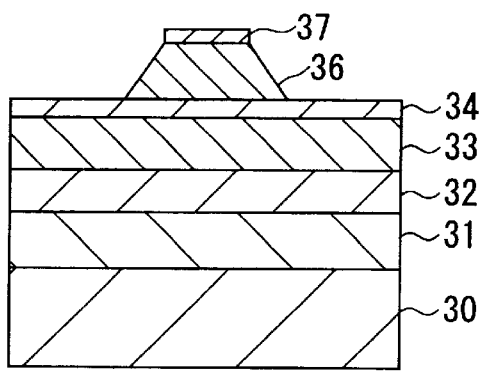

In the next step, the p-type upper cladding layer 36 and the current facilitating layer 37 are subjected to a selective etching so as to form these p-type upper cladding layer 36 and the current facilitating layer 37 in the shape of a ridge, as shown in FIG. 6B.

Figure 6C:
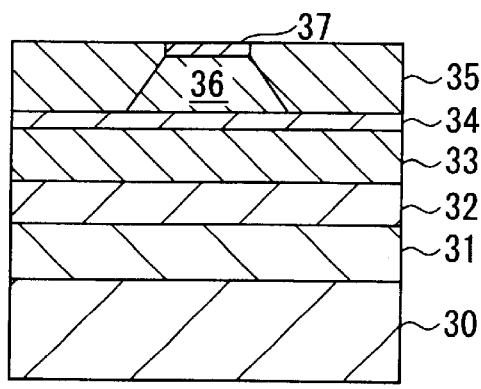
Figure 6D:
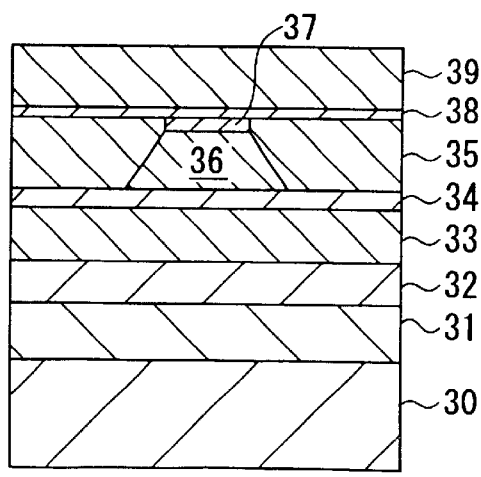
Figure 7:
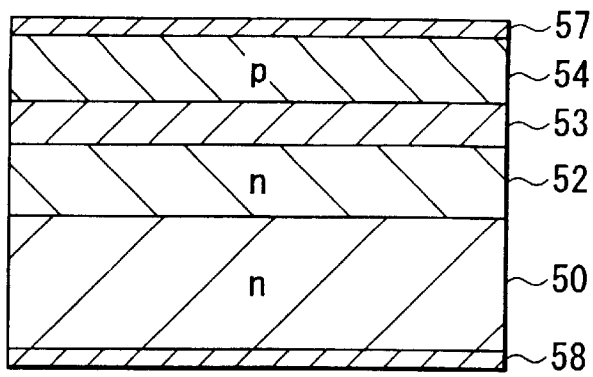
FIG. 7 is a cross sectional view showing the construction of a conventional LED element.

Further, a layer formation process is performed to form selectively an n-type GaAs layer 35 around the ridge-shaped p-type upper cladding layer 36 and the current facilitating layer 37, as shown in FIG. 6C. The upper surfaces of the current facilitating layer 37 and the n-type GaAs layer 35 are processed flat by a CMP method, followed by forming a Zn diffusion preventing layer 38 on the entire surface by the MOCVD method as shown in FIG. 6D. Finally, a p-type GaAs layer 39 is formed on the Zn diffusion preventing layer 38, thereby forming the basic structure of the semiconductor laser according to the second embodiment of the present invention.

As described above, the Zn diffusion preventing layer specified in the present invention can be applied to not only an LED but also to a semiconductor laser so as to achieve a high light emission efficiency. It follows that the present invention provides a light emitting element capable of maintaining stable characteristics over a long period.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor light-emitting element, comprising:
   a double hetero structure formed of III–V group compound semiconductor layers including an active layer acting as a light emitting layer and an n-type cladding layer and a p-type cladding layer having the active layer sandwiched therebetween;
   a p-type layer laminated on said double hetero structure and containing a concentration of Zn as a dopant; and
   a Zn diffusion preventing layer interposed between said double hetero structure and the p-type layer.

2. The semiconductor light-emitting element according to claim 1, wherein said double hetero structure is formed of an InGaAlP series material.

3. The semiconductor light-emitting element according to claim 1, wherein said Zn diffusion preventing layer is doped with a p-type dopant of Zn and an n-type dopant of Si, and the concentrations of the Zn and Si dopants satisfy the conditions of Na>Nd and Nd>$2 \times 10^{17}$ cm$^{-3}$, where Na represents the concentration of the dopant Zn, and Nd represents the concentration of the dopant Si.

4. The semiconductor light-emitting element according to claim 1, wherein said Zn diffusion preventing layer has a composition of In$_{0.5}$(Ga$_{1-x}$Al$_x$)$_{0.5}$P where x is larger than 0 and smaller than 1 (0<x<1).

5. A semiconductor light-emitting element, comprising:
   a double hetero structure formed of III–V group compound semiconductor layers including an active layer acting as a light emitting layer and an n-type cladding layer and a p-type cladding layer having the active layer sandwiched therebetween;
   a p-type substrate containing Zn as a dopant, formed of a material transparent to the light emitted from said light emitting layer, and said p-type cladding layer included in said double hetero structure being formed on said p-type substrate; and
   a Zn diffusion preventing layer formed between said double hetero structure and said p-type substrate.

6. The semiconductor light-emitting element according to claim 5, wherein said double hetero structure is formed of an InGaAlP series material, and said p-type substrate is formed of a p-type GaP.

7. The semiconductor light-emitting element according to claim 5, wherein said Zn diffusion preventing layer has a composition of In$_{0.5}$(Ga$_{1-x}$Al$_x$)$_{0.5}$P where x is larger than 0 and smaller than 1 (0<x<1).

8. The semiconductor light-emitting element according to claim 5, wherein said Zn diffusion preventing layer is doped with a p-type dopant of Zn and an n-type dopant of Si, and the concentrations of the Zn and Si dopants satisfy the conditions of Na>Nd and Nd>$2 \times 10^{17}$ cm$^{-3}$, where Na represents the concentration of the dopant Zn, and Nd represents the concentration of the dopant Si.

9. An LED (light emitting diode), comprising:
   a p-type substrate containing Zn as a dopant;
   a first electrode formed on the lower surface of said substrate;
   a p-type buffer layer formed on the upper surface of said substrate;
   a p-type adhesive layer bonded to said buffer layer;

a Zn diffusion preventing layer formed on said adhesive layer;

a p-type cladding layer formed on said Zn diffusion preventing layer;

an active layer formed on said p-type cladding layer;

an n-type cladding layer formed on said active layer;

an electrode diffusion layer formed on said n-type cladding layer; and a second electrode formed on said electrode diffusion layer.

10. A semiconductor laser, comprising:

a substrate;

an n-type cladding layer formed on said substrate;

an active layer formed on said n-type cladding layer;

a lower p-type cladding layer formed on said active layer;

an etching stopper layer formed on said lower p-type cladding layer;

a ridge-shaped upper p-type cladding layer formed on said etching stopper layer;

a current facilitating layer formed on said upper p-type cladding layer;

an n-type layer formed around said upper p-type cladding layer and said current facilitating layer;

a Zn diffusion preventing layer formed commonly on said current facilitating layer and said n-type layer; and a p-type layer containing Zn as a dopant and formed on said Zn diffusion preventing layer.

11. The semiconductor light-emitting element according to claim 5, wherein said p-type substrate is bonded directly to said p-type cladding layer.

* * * * *